United States Patent [19]

Faulhaber

[11] Patent Number: 4,578,598
[45] Date of Patent: Mar. 25, 1986

[54] RANDOM PULSE GENERATOR CIRCUIT

[75] Inventor: Mark E. Faulhaber, Wilmington, Del.

[73] Assignee: E. I. Du Pont de Nemours and Company, Wilmington, Del.

[21] Appl. No.: 631,650

[22] Filed: Jul. 17, 1984

[51] Int. Cl.[4] ............... H03L 29/00; H03L 7/00; G06F 1/02
[52] U.S. Cl. .................... 307/271; 328/59; 331/78; 364/717
[58] Field of Search ............... 307/106, 271; 328/59; 364/717; 331/78

[56] References Cited

U.S. PATENT DOCUMENTS

| 3,575,606 | 4/1971 | Bledsoe | 307/106 |
| 4,176,399 | 11/1979 | Hoffman et al. | 364/717 |
| 4,395,703 | 7/1983 | Piosenka | 364/717 |
| 4,507,796 | 3/1985 | Stumfall | 331/78 |

Primary Examiner—Stanley D. Miller
Assistant Examiner—B. P. Davis

[57] ABSTRACT

A random pulse generator which includes a voltage-to-frequency converter coupled to a voltage source providing a random voltage sequence, produces a train of logic pulses that can be randomized in a multi-mode manner on either a pulse rate or period basis with control over the percent variability. The durations of the on-off portions of the pulse train are separately adjustable.

4 Claims, 5 Drawing Figures

RANDOM PULSE GENERATOR CIRCUIT

BACKGROUND OF THE INVENTION

This invention relates to circuits for producing electrical pulses that can be randomized. More particularly, it relates to a circuit that produces electrical pulses that can be randomized on either a pulse rate or a period basis, with control over the percent variability.

Bledsoe discloses in U.S. Pat. No. 3,575,606 a controlled random pulse generator which is capable of producing random output pulses within a predetermined range of minimum and maximum periods. In the preferred embodiment circuit means are provided for independently controlling the minimum and maximum periods. Although Bledsoe's signal generator randomizes the pulse occurrences within prescribed time limits it is incapable of independently controlling the randomness of the on and off portions of the pulse train, e.g., pulse width.

SUMMARY OF THE INVENTION

According to the invention a circuit is provided for generating a sequence of electrical pulses wherein the pulse duration, the pulse interval, the pulse repetition frequency and the degree of randomness of the pulse repetition frequency or the pulse interval are selectable. The circuit includes a voltage-to-frequency converter for generating binary-valued pulses at its output terminal which are fed back to clock a random number generator which in turn supplies a new random voltage at the input of the voltage-to-frequency converter. Control of the average voltage input to the voltage-to-frequency converter and the use of a divider circuit connected to its output provide pulse rate adjustment.

DETAILED DESCRIPTION OF THE PREFERRED EMBODIMENT

Figure 1:
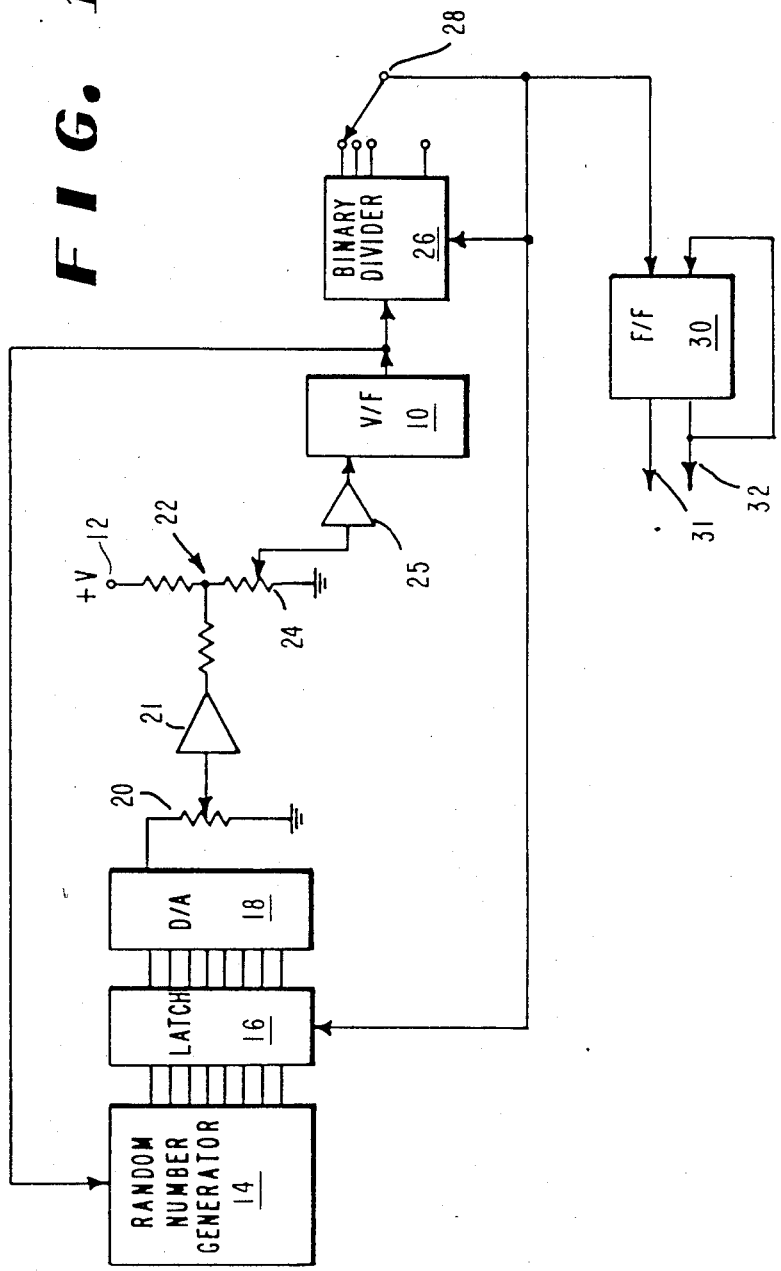
FIG. 1 is a block diagram of the random pulse generator circuit of this invention.

Referring to FIG. 1 a voltage-to-frequency (V/F) converter 10 is provided to generate a continuous stream of binary-valued pulses at a rate directly proportional to the input voltage. In this case the input voltage comprises the sum of a fixed voltage 12, which defines an average pulse rate, and a random voltage, which defines the degree of variation of the pulse rate about its average value. The V/F converter 10 is operated so as to produce pulse rates somewhat higher than what is needed at the final system output terminals 31, 32.

The random component of the pulse-rate-determining-voltage is conveniently obtained by means of a pseudorandom number generator 14, coupled to a digital-to-analog (D/A) converter 18 through a data latch 16. The D/A converter 18 is configured to produce a bipolar analog voltage which varies in proportion to the size of the digital word input to it via the data latch 16. The D/A converter 18 uses offset binary decoding, i.e., the most significant bit of the digital word determines the polarity of the voltage, and the remaining bits determine the voltage magnitude. The bipolar voltages produced by this part of the circuit are random from one sample to the next, and the probability of occurrence of any voltage in the range of the D/A converter is equal to any other. Statistically speaking, the voltage samples are randomly and uniformly distributed between fixed limits with a zero average value.

The degree to which the final input to the V/F converter 10 contains a random component is determined by the setting of potentiometer 20. The fixed component contribution is scaled by a resistive mixing network such that at network node 22 the fixed voltage and the maximum random voltage have equal weight. This allows potentiometer 20 to be calibrated in percent variability about the average. Potentiometer 24 permits the mixture of fixed and random components to vary over a 2:1 range, while maintaining unchanged the ratio of these components as defined by the setting of potentiometer 20.

Because the pulse generator's final output must cover a wide range of pulse rates, the system is designed to make available a selection of fixed ranges to provide a coarse pulse-rate control, and means to interpolate within each range to provide a fine control. To accomplish this, the output of the V/F converter 10 is input to a binary divider 26 which provides outputs for each divisor stage. Switch 28 selects the approximate pulse rate desired. Since succeeding divider outputs differ by a factor of two from one another, and the non-random voltage input to the V/F converter 10 can be varied over a 2:1 range by potentiometer 24, the circuit will produce the desired result of continuous pulse rate adjustment over a wide range. The undivided pulses from the V/F converter 10 also are used as a convenient clock for the random number generator 14 which at each clock pulse produces a new random number.

Each half-cycle of the final output pulse period is generated independently, i.e., the "on" time and "off" time durations are separately determined for each cycle. When the number of V/F converter 10 output pulses equals that selected by switch 28 the divider 26 output will change from a logic level 0 to a logic level 1. This signal then starts the next half-cycle of the output pulse by toggling flip-flop 30 and resetting the divider 26. The transition also triggers data latch 16 to sample the next random number whose analog voltage value, attenuated by potentiometer 20, is added to a fixed voltage at junction 22 via buffer 21. It is the voltage at junction 22 after modification by potentiometer 24 and isolation by buffer 25 that instantaneously determines the pulse rate at the output of the V/F converter 10. This pulse rate remains constant for the instant half-cycle. When the binary divider 26 output signal changes to a logic 1 at the pole of switch 28, the procedure described above is repeated.

Thus the circuit represented in FIG. 1 discloses the option of obtaining output pulses having, on the average, a 50% on-off duty cycle with selectable pulse rate and percent variability independently applied to each portion of the cycle. The random pulse output can be obtained from either or both outputs 31, 32 of flip-flop 30, the two outputs being the complements of one another.

Figure 2:
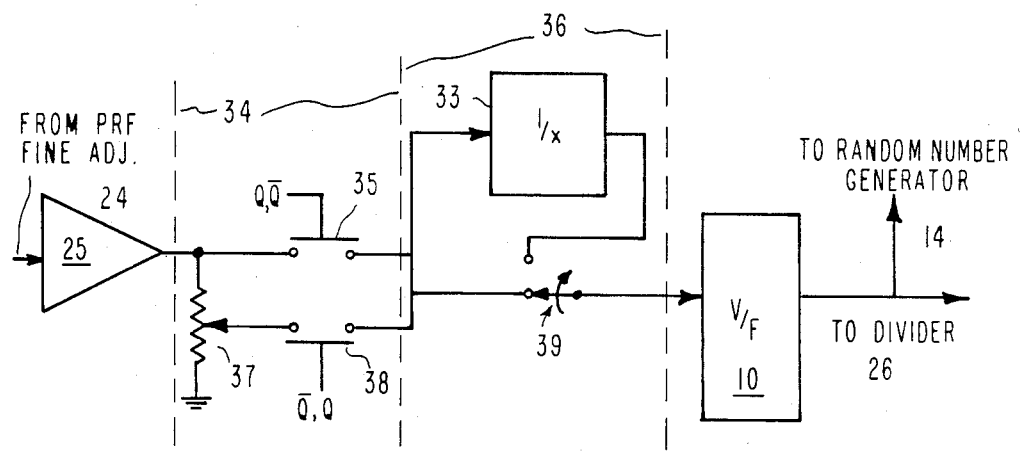
FIG. 2 illustrates a block diagram representing a circuit for changing the duty cycle of the output pulse and for developing a reciprocal input control voltage for the voltage-to-frequency converter of FIG. 1.

FIG. 2 discloses two subcircuits not included in FIG. 1: Circuit 34, comprising means for changing the average duty cycle of the output pulse, and Circuit 36, including means for developing a control voltage for the V/F converter 10 which is the reciprocal of the linear pulse rate control signal previously described.

Circuit 34 employs two logic controlled switches 35, 38 connected in a SPDT configuration between PRF fine adjust potentiometer 24 and the input terminal of V/F converter 10. TIME adjust potentiometer 37 attenuates the voltage input to the V/F converter 10 on alternate half-cycles, since the switches are controlled by the outputs of flip-flop 30. A control element (shown as a mode switch 51 of FIG. 4a) is used to select whether the attenuated input is to be chosen during the "on" or "off" part of the cycle, lengthening the time of that portion, and therefore modifying the average duty cycle.

Circuit 36 allows switching the V/F converter input between a linearly produced control voltage and its reciprocal by means of SPDT switch 39 and an analog divider 33. In using the random pulse generator to control the application of dye modifiers to yarn as disclosed in our copending application Ser. No. 631,747, now abandoned, settings near 100% variability in V/F converter input result in output pulse rates near zero thus producing long continuous sections of applied or missing yarn finish. This is the result of bounding the pulse rate between zero and 2F at 100% variability. The analog divider 33 can be used in this situation to bound the pulse rate between 0.5F and the full-scale output of the V/F converter at 100% variability setting. In practice, the very short control pulses have little effect on the yarn aesthetics owing to the limited response time of the ultrasonic applicator. At variabilities less then 90%, there is little difference in the output pulse characteristics between the two methods (rep rate vs. duration keying).

Figure 3:
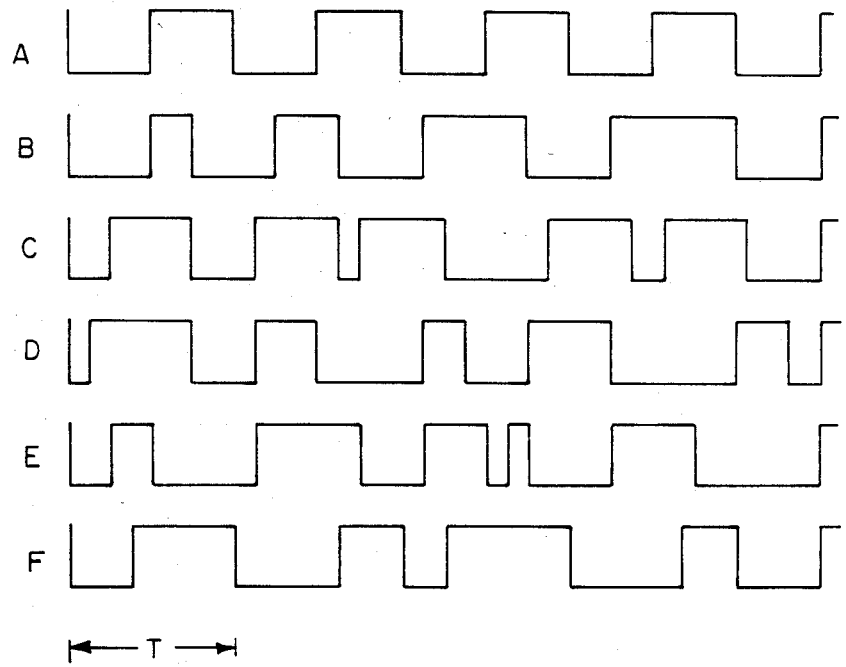
FIGS. 3A-3F illustrate output wave forms of the various modes of operation for random pulse generator.

As mentioned earlier, the random pulse generator can be set up to produce a variety of pulse characteristics by selectively switching the reset and flip-flop output pulses to control the data latch 16, and duty-cycle switches 35, 38. There are basically five modes of operation for the random pulse generator; output waveforms for these are shown in FIG. 3. These waveforms are obtained using a setup of 50% average duty cycle (TIME potentiometer 37 set to maximum output). Waveform 3A shows the condition when the variability is zero. Waveform 3B shows a mode where the "on" period of the pulse is randomized, but the "off" period is fixed. Waveform 3C shows a mode where the "on" period is fixed and the "off" period is random. Waveform 3D shows a mode where both the "on" and "off" periods are random. Waveform 3E shows a randomizing of the pulse repetition frequency while maintaining the duty cycle constant. Finally, Waveform 3F shows the mode where the pulse repetition frequency is maintained fixed and the duty cycle is randomized. Sub-modes of these are programmable depending on whether the duty cycle is greater or less than 50%, and whether the analog divider 33 (FIG. 2) is employed. In all cases, the outputs shown and their logical complements are available simultaneously in each mode.

Figure 4A:
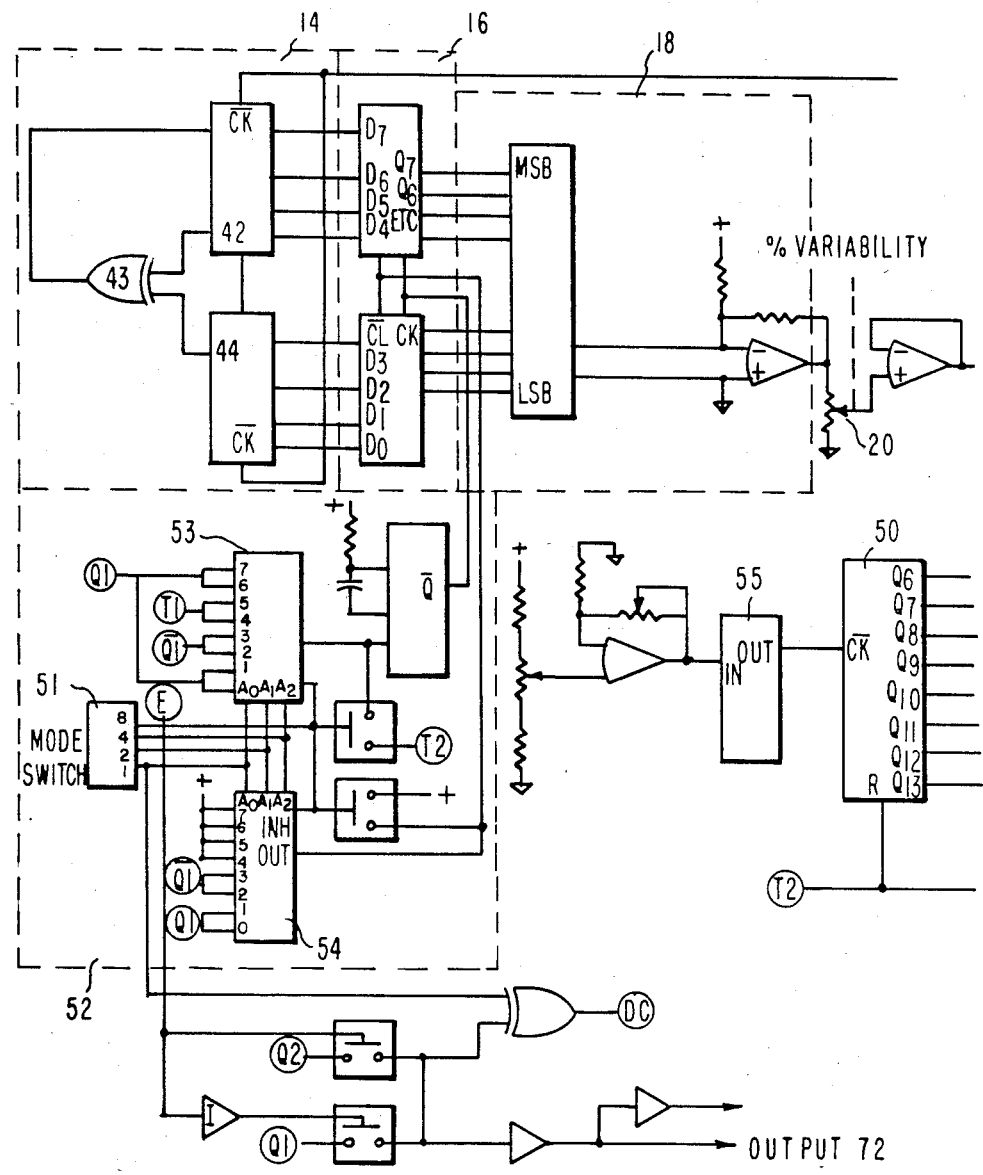
FIGS. 4a and 4b are detailed circuit schematics of the block diagram of FIG. 1.
Figure 4B:
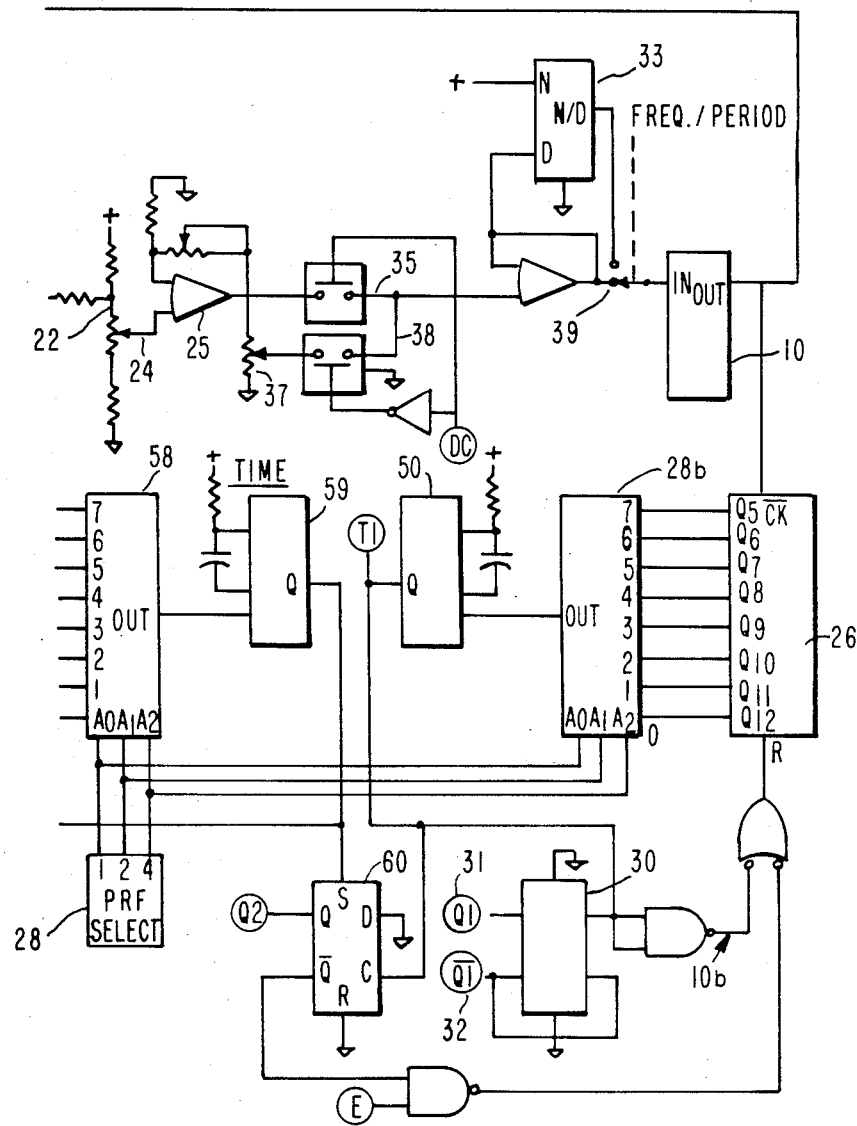

FIGS. 4a and 4b are detailed circuit schematics that when fitted together in a side-by-side relationship embody a detailed version of the block diagram of FIG. 1. Random number generator 14 comprises a 36-bit shift register made up of two serially connected type 4006 shift registers 42, 44 that are simultaneously clocked by the output of V/F converter 10, and a feedback circuit 43 performing an exclusive OR function on the outputs of the register. This connection produces a pseudorandom sequence of pulses at each output stage which repeats after every $2^{31}$ clock pulses (over 2 billion). In this case, the sequence would not repeat for 8 hours or more, enough to ensure practical randomness.

Eight of the output stages of the shift register are chosen to form a random 8-bit parallel word whose value changes at each clock pulse. The 8-bit shift register output is connected to a type DAC08B digital to analog (D/A) converter (Datel) 18 through two 74C175 data latches 16. These latches obtain and hold both the true and complement values of the input bits. In this case, the most significant bit is complemented so that when the latch is reset, it will output 1000 0000, converting the binary input to offset binary, where the MSB defines the polarity of the signal. The code 1000 0000 is converted by the D/A 18 to zero volts. Code 1111 1111 will produce −5 volts, and Code 0111 1111 will produce +5 volts. (The shift register random number generator must have a 1 somewhere in its first 31 stages to function; however, using only 8 of the 36 outputs for the data makes the code 0000 0000 possible. The distribution of output codes is uniform, except for the 0000 0000 condition whose probability is reduced slightly by the aforementioned limitation.)

The circuit from the output of D/A converter 18 to divider 26 has already been explained relative to FIGS. 1 and 2.

Divider 26 is a 12-stage binary counter type 4020 which divides the V/F converter 10 output to provide a wide selection of system output pulse rates. Outputs Q5 through Q12 are selected individually by an 8-input multiplexer 28b, type 4051, by means of an octal-coded panel switch 28 which controls the multiplexer address lines. The output of the multiplexer is connected to the input of a pulse-stretching one-shot 50 which, when the selected count of V/F converter pulses is satisfied, toggles flip-flop 30 and resets counter 26. The highest range setting for counter 26 is a Q5 output, meaning it takes 32 pulses from the V/F converter 10 for each half-cycle of system output. Since the random number generator produces a new value at each V/F converter pulse, there is little likelihood that successive D/A converter samples will be statistically correlated.

The remaining circuitry is best explained in terms of the operation of the generator in each of its modes. Mode select circuit 52 comprises two 8-input multiplexers 53, 54 under the simultaneous control of a binary-coded-decimal address select (MODE) switch 51. The operating modes of the random pulse generator are the following:

Mode 0

Random on: Fixed Off;

Average On time < 50% of Cycle

At the beginning of the cycle, flip-flop 30 with $Q_1$ going high enables latches 16 to sample a random 8-bit word. The analog of that word modified by the setting of % variability potentiometer 20 is mixed with a fixed voltage (100%) and input directly through switch 35 to V/F converter 10. When counter 26 reaches the count selected by multiplexer 28b, one-shot 50 toggles flip-flop 30 bringing Q1 low, and resets counter 26 through logic gate network 10b. When Q1 goes low, latches 16 are reset, producing an analog of zero volts for the variability of the second part of the cycle. The fixed voltage from potentiometer 24 after buffering by amplifier 25 then passes via potentiometer 37 through switch 38 to V/F converter 10. Again the V/F converter output is counted via counter 26 until the selected count triggers one-shot 50 which toggles flip-flop 30 and resets counter 26. Q1 goes high enabling latches 16 to sample a new random 8-bit word and begin the next cycle.

Mode 1

Random On; Fixed Off;

Average On time > 50% of Cycle

Same as Mode 0 except that switch 38 is enabled on the first part of the cycle and switch 35 is enabled during the OFF time.

Mode 2

Random Off; Fixed On;

Average On time < 50% of Cycle

At the beginning of the On part of the cycle, Q1 going high resets latches 16 producing a zero variability voltage. At the start of the Off period, Q1 going low enables latches 16 to sample a random 8-bit word. Switch 35 terminal 1 is enabled during On, Switch 38 is enabled during Off.

Mode 3

Random Off; Fixed On;

Average On time > 50% of Cycle

Same as Mode 2 except Switch 38 is enabled during On and switch 35 is enabled during Off.

Mode 4

Random On; Random Off;

Average On time < 50% of Cycle

In this mode, a random word is sampled by latches 16 for both the On and Off periods by using the one-shot 50 output at the terminus of the selected count for both periods. For an average On time 50% switch 35 is enabled during On, switch 38 is enabled during Off.

Mode 5

Random On; Random Off;

Average On time > 50% of Cycle

Same as Mode 4 except switch 38 is enabled during On and switch 35 is enabled during Off.

Mode 6

Random Pulse Repetition Frequency; Fixed

On/Off Ratio; On Time < 50% of Cycle

In this mode a random word is selected only once per cycle at the beginning of the On time. Switch 35 is enabled during On and switch 38 is enabled during Off.

Mode 7

Random Pulse Repetition Frequency; Fixed

On/Off Ratio; On Time > 50% of Cycle

Same as Mode 6 except switch 38 is enabled during On and switch 35 is enabled during Off.

Mode 8

Random On/Off Ratio; Fixed Pulse Repetition

Frequency; Average On time = 50% of Cycle

In this mode, the fixed pulse repetition frequency is obtained from a second V/F converter 55 and counter 56 with a multiplexer switch 58 which selects counts twice as long as those generated by counter 26. At the start of the cycle, counter 56 has already produced through multiplexer 58 a trigger signal, indicating the end of the previous cycle and triggering one-shot 59. One-shot 59 resets counter 56, sets flip-flop 60 and enables latches 16 to sample a random 8-bit word. The fixed and variable voltage components pass through switch 35 to V/F converter 10. When counter 26 produces the selected division, one-shot 50 clocks flip-flop 60 which resets counter 26 for the rest of the cycle until counter 56 times out to start a new cycle. Since counter 26 is reset during the Off time, switch 38 and the TIME potentiometer 37 have no effect and the On time will always average 50%.

Mode 9

Random On/Off Ratio; Fixed Pulse Repetition

Frequency; Average On time > 50% of Cycle

Same as Mode 8 except that switch 38 and TIME potentiometer 37 are active during the On time. If an On time < 50% is needed, the inverse output signal at terminal 72 will provide it.

I claim:

1. A circuit for generating a sequence of electrical pulses wherein the pulse duration, the pulse interval, the pulse repetition frequency, the degree of randomness of the pulse repetition frequency and the pulse interval are selectable said circuit comprising:
   (a) a voltage-to-frequency converter for generating binary-valued pulses, said converter having an output terminal to supply said binary-valued pulses and an input terminal to receive an input voltage comprising the sum of a fixed voltage which defines average pulse rate, and a random voltage, which defines a degree of variation of the pulse rate;
   (b) a first voltage source for supplying said random voltage;
   (c) a second voltage source for said fixed voltage;
   (d) circuit means for connecting said random voltage and said fixed voltage to said input terminal of the voltage-to-frequency converter; and
   (e) circuit means to divide the output pulses of said voltage-to-frequency converter and vary the average voltage applied to the input terminal of the voltage-to-frequency converter for providing pulse rate adjustment.

2. The circuit of claim 1, wherein said voltage source for supplying said random voltage is a random number generator.

3. The circuit of claim 2 including circuit means for connecting said voltage-to-frequency converter output terminal to said random number generator for clocking said generator.

4. The circuit of claim 1 including a subcircuit connected between the circuit means for connecting said random voltage and said fixed voltage to the input of the voltage-to-frequency converter and said voltage-to-frequency converter for changing the average duty cycle of the output of the voltage-to-frequency converter.

* * * * *